United States Patent
Yuasa (10) Patent No.: US 7,057,288 B2
(45) Date of Patent: Jun. 6, 2006

(54) ELECTRIC DEVICE AND METHOD FOR FABRICATING THE SAME

(75) Inventor: Hiroshi Yuasa, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/459,616

(22) Filed: Jun. 12, 2003

(65) Prior Publication Data

US 2003/0235979 A1 Dec. 25, 2003

(30) Foreign Application Priority Data

Jun. 20, 2002 (JP) ............................. 2002-179592

(51) Int. Cl.
*H01L 23/535* (2006.01)
(52) U.S. Cl. ....................... 257/759; 257/758
(58) Field of Classification Search ................ 257/758, 257/759, 760
See application file for complete search history.

(56) References Cited

U.S. PATENT DOCUMENTS

| | | | | |
|---|---|---|---|---|
| 5,616,959 A | * | 4/1997 | Jeng ............................ | 257/758 |
| 6,162,743 A | * | 12/2000 | Chu et al. .................... | 438/781 |
| 6,291,628 B1 | * | 9/2001 | Chen et al. .................. | 528/169 |
| 6,483,193 B1 | * | 11/2002 | Usami ......................... | 257/758 |
| 2002/0052106 A1 | * | 5/2002 | Ikura .......................... | 438/624 |

FOREIGN PATENT DOCUMENTS

JP P2002-93903 A 3/2002

* cited by examiner

*Primary Examiner*—Jerome Jackson
(74) *Attorney, Agent, or Firm*—McDermott Will & Emery LLP (57) ABSTRACT

A wiring groove is formed in an insulating film, and then a reformed layer is formed in the vicinity of the wiring groove in the insulating film. Thereafter, a conductive film is buried in the wiring groove, thereby forming a wire. Subsequently, the reformed layer is removed to form a slit, and then a low-dielectric-constant film having a relative dielectric constant lower than the insulating film is buried in the slit.

23 Claims, 5 Drawing Sheets

ELECTRIC DEVICE AND METHOD FOR FABRICATING THE SAME

BACKGROUND OF THE INVENTION

The present invention relates to electric devices and methods for fabricating the same, and especially relates to techniques for forming wiring.

With recent increase in packaging density for integrated circuits, intervals between wires have been reduced, resulting in increased electrical parasitic capacitances created between the wires (hereinafter, referred to as wire-to-wire capacitances). However, reduction in the wire-to-wire capacitances has been needed in integrated circuits that require high-speed operation.

In view of this, to reduce the wire-to-wire capacitance, methods for reducing the relative dielectric constant of an insulating film provided between wires (hereinafter, also referred to as an inter-wiring insulating film) have been developed (see Japanese Laid-Open Publication No. 2002-93903, for example).

Hereinafter, a known method for fabricating an electric device will be described with reference to the drawings.

FIGS. 5A through 5C and FIGS. 6A through 6C are cross-sectional views showing respective process steps of a known method for fabricating an electric device.

Figure 5A:
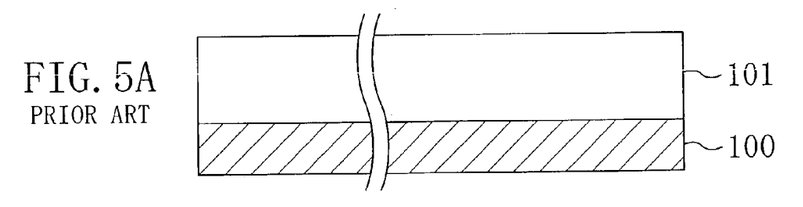
FIGS. 5A through 5C are cross-sectional views showing respective process steps of a known method for fabricating an electric device.
Figure 5B:
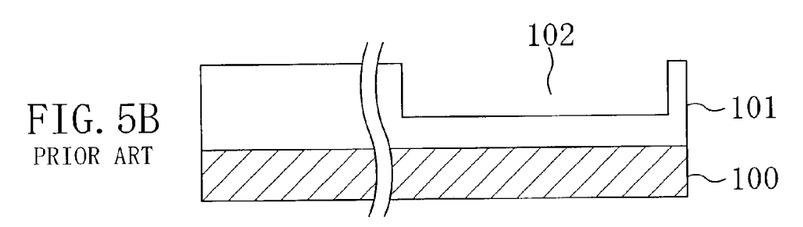

First, as shown in FIG. 5A, an insulating film 101 made of a first insulating material is formed over the entire surface of a semiconductor substrate 100, and then the insulating film 101 is selectively etched, thereby forming a recess 102 in a signal-delay-prevention region (i.e., a region where a signal line is to be formed) of the insulating film 101, as shown in FIG. 5B. In this case, the etching time is controlled, thereby allowing the insulating film 101 to remain under the recess 102.

Figure 5C:
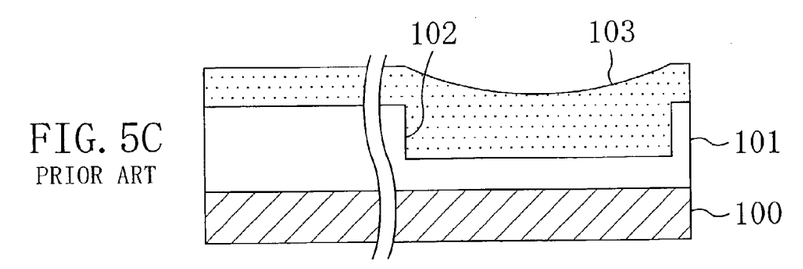

Next, as shown in FIG. 5C, a low-dielectric-constant insulating film 103 made of a second insulating material is formed over the insulating film 101 to fill the recess 102 completely.

Figure 6A:
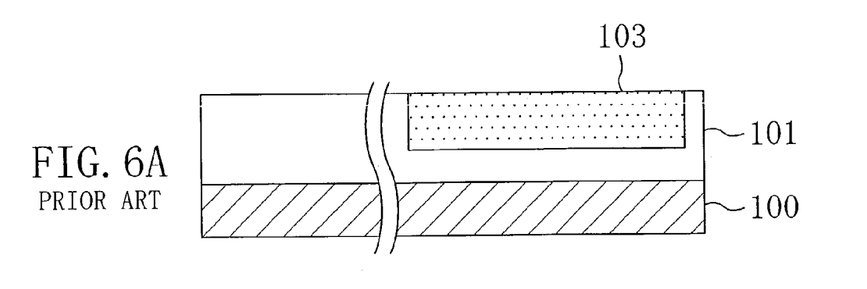
FIGS. 6A through 6C are cross-sectional views showing respective process steps of the known method.

Subsequently, as shown in FIG. 6A, part of the low-dielectric-constant insulating film 103 located outside the recess 102 (i.e., part of the low-dielectric-constant insulating film 103 located above the upper surface of the insulating film 101) is removed by, for example, chemical mechanical polishing (CMP). This makes the upper surface of the low-dielectric-constant insulating film 103 flush with the upper surface of the insulating film 101.

Figure 6B:
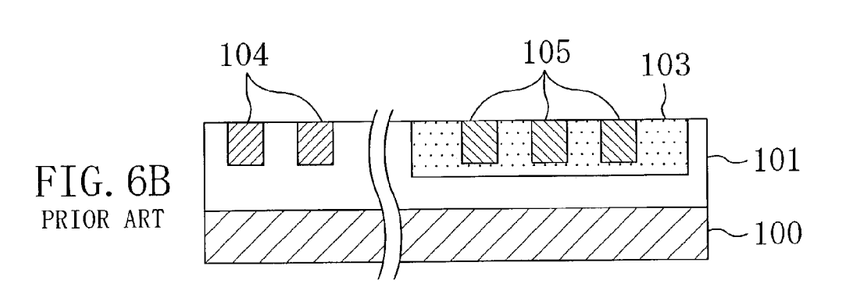

Then, a plurality of wiring grooves are formed in each of the low-dielectric-constant insulating film 103 and the insulating film 101 (i.e., the region other than the signal-delay-prevention region), and then a metal film made of copper or an alloy of copper is deposited over the entire surfaces of the low-dielectric-constant insulating film 103 and the insulating film 101. Thereafter, part of the metal film located outside the wiring grooves (i.e., part of the metal film located above the respective upper surfaces of the low-dielectric-constant insulating film 103 and the insulating film 101) is removed by, for example, CMP. In this way, as shown in FIG. 6B, power-source lines 104 are formed in the wiring grooves in the insulating film 101 (i.e., the region other than the signal-delay-prevention region), and signal lines 105 are formed in the wiring grooves in the low-dielectric-constant insulating film 103.

Figure 6C:
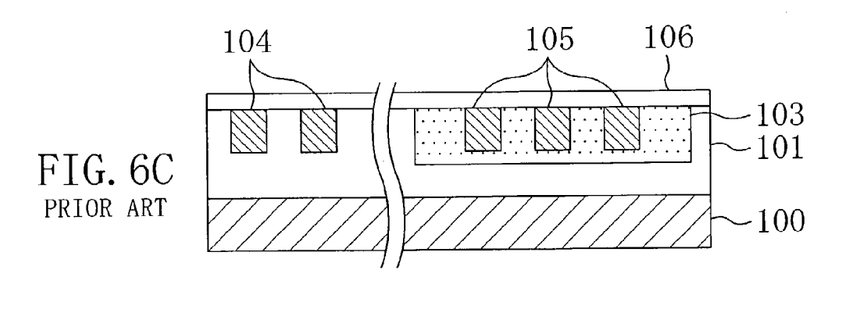

Lastly, as shown in FIG. 6C, a diffusion barrier layer 106 for preventing copper from diffusing is formed over the entire surfaces of the power-source lines 104, signal lines 105, lower-dielectric-constant insulating film 103 and insulating film 101.

With the known method described above, a low-dielectric-constant film can be selectively formed in a region where a fabricator does not want a wiring delay to occur and, in addition, the mechanical strength of the wiring structure can be maintained.

In the known method, if wires are arranged densely and the whole of a wiring layer can maintain its mechanical strength by utilizing the high mechanical strength of the wiring itself, a low-dielectric-constant insulating film with low mechanical strength can be used as an inter-wiring insulating film. However, if wires are arranged sparsely and the low-dielectric-constant insulating film is used as an inter-wiring insulating film, the mechanical strength of the whole wiring layer cannot be maintained only by the mechanical strength of the wiring itself.

In addition, in the known method, the use of a plurality of insulating films made of mutually different materials as inter-wiring insulating films in a wiring layer requires a special masking process (e.g., a lithography process and an etching process) (see FIG. 5B). Moreover, it is generally difficult to form a minute pattern of a low-dielectric-constant film using a mask.

SUMMARY OF THE INVENTION

It is therefore an object of the present invention to achieve a wring structure in which sufficient mechanical strength thereof is maintained while reducing the wire-to-wire capacitance using a low-dielectric-constant insulating film with insufficient mechanical strength.

In order to achieve this object, an inventive method for fabricating an electric device includes the steps of: depositing an insulating film over a substrate; forming a wiring groove in the insulating film; forming a reformed layer in part of the insulating film located in the vicinity of the wiring groove; burying a conductive film in the wiring groove, thereby forming a wire, after the step of forming the reformed layer has been performed; removing the reformed layer, thereby forming a silt, after the step of forming the wire has been performed; and burying, in the slit, a low-dielectric-constant film having a relative dielectric constant lower than that of the insulating film.

With the inventive method for fabricating an electric device, a low-dielectric-constant film having a very low relative dielectric constant can be formed in the vicinity of (i.e., the portion adjacent to) wiring in a wiring layer, so that the effect of reducing the wire-to-wire capacitance is considerably high. On the other hand, an insulating film having a relative dielectric constant higher than that of the low-dielectric-constant film, i.e., an insulating film having mechanical strength higher than that of the low-dielectric-constant film, is formed in the part of wire-to-wire spaces other than the vicinity of the wiring, so that mechanical strength sufficient for the whole wiring layer (e.g., the strength with which the layer can sufficiently withstand a CMP process) is achieved.

In addition, with the inventive method for fabricating an electric device, after a wiring groove has been formed in an insulating film, a reformed layer is formed in part of the insulating film located in the vicinity of the wiring groove, and then a conductive film is buried in the wiring groove, thereby forming a wire. Subsequently, the reformed layer is selectively removed to form a slit, and then a low-dielectric-constant film is buried in the silt. As a result, the following advantages are obtained. That is to say, even in the case where a plurality of insulating films made of mutually different materials are used as inter-wiring insulating films in an identical wiring layer, no special masking process is needed. In addition, a pattern for wiring groove is formed in the low-dielectric-constant film without using a mask, thus forming a minute wiring structure.

In the inventive method for fabricating an electric device, the wiring groove may include: a plurality of first wiring grooves with relatively narrow spaces left therebetween; and a plurality of second wiring grooves with relatively wide spaces left therebetween, and the step of forming the reformed layer may include the step of forming the reformed layer in the entire part of the narrow spaces between the first wiring grooves in the insulating film and in a part of the wide spaces between the second wiring grooves (including the respective vicinities of the second wiring grooves) in the insulating film. An inventive electric device thus fabricated is an electric device in which a plurality of first wires with relatively narrow spaces left therebetween and a plurality of second wires with relatively wide spaces left therebetween are provided in an identical wiring layer. More specifically, in the electric device, a low-dielectric-constant film is provided in the entire part of the small spaces between the first wires in the wiring layer and in a part of the wide spaces between the second wires (including the respective vicinities of the second wires) in the wiring layer, and an insulating film having mechanical strength higher than that of the low-dielectric-constant film is provided in the other part of the wide spaces between the second wires.

In this device, a wiring structure including a low-dielectric-constant film provided in a region adjacent to wires and an insulating film with high mechanical strength provided in wide wire-to-wire spaces. Therefore, it is possible to reduce the wire-to-wire capacitance, while maintaining the mechanical strength of the whole wiring structure.

DESCRIPTION OF THE PREFERRED EMBODIMENTS

Embodiment 1

Hereinafter, a method for fabricating an electric device according to a first embodiment of the present invention will be described with reference to the drawings.

FIGS. 1A through 1F are cross-sectional views showing respective process steps of the method for fabricating an electric device of the first embodiment.

Figure 1A:
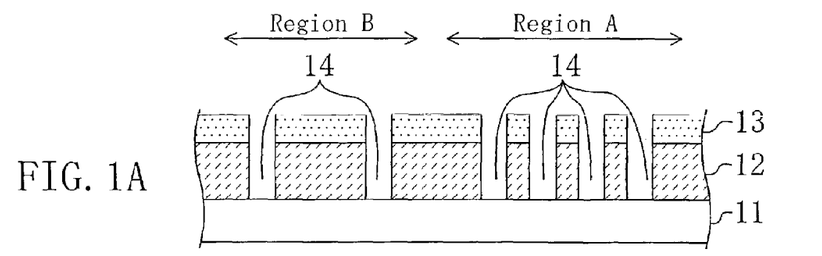
FIGS. 1A through 1F are cross-sectional views showing respective process steps of a method for fabricating an electric device according to a first embodiment of the present invention.

First, as shown in FIG. 1A, a first insulating film 11 of, for example, a silicon oxide film is deposited to a thickness of about 300 nm over a silicon substrate (not shown). Then, a second insulating film 12 of, for example, a carbon-containing silicon oxide film (an SiOC film) is deposited by, for example, a plasma CVD (chemical vapor deposition) process to a thickness of about 350 nm. In this case, the second insulating film 12 has a hardness of about 1.5 GPa and a relative dielectric constant of about 3.0.

Next, a resist is applied onto the second insulating film 12, and then a resist pattern 13 having a wiring-groove pattern is formed by, for example, a lithographic process using KrF excimer laser light or ArF excimer laser light. Thereafter, the second insulating film 12 is etched by a dry etching process using plasma of a gas containing a CF-based gas as a main component (e.g., a gas containing, for example, $CF_4$, $CHF_3$, argon and oxygen), with the resist pattern 13 used as a mask, thereby forming wiring grooves 14.

In this embodiment, the wiring grooves 14 include a plurality of wiring grooves relatively closely spaced (region A) and a plurality of wiring grooves relatively widely spaced (region B).

Figure 1B:
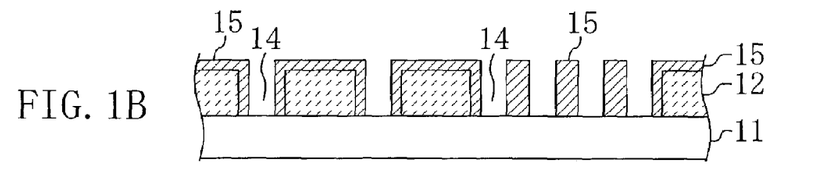

Thereafter, as shown in FIG. 1B, the resist 13 is removed by dry etching using, for example, oxygen plasma. At the same time, the second insulating film 12 is also exposed to the oxygen plasma. Since the second insulating film 12 is made of a carbon-containing silicon oxide film, the surface portion of the second insulating film 12 (i.e., the upper portion of the second insulating film 12 and the portions of the second insulating film 12 serving as walls of the wiring grooves 14) are easily oxidized by the oxygen plasma. As a result, carbon is eliminated from the carbon-containing silicon oxide film in the surface portion of the second insulating film 12, thereby forming a reformed layer 15. The reformed layer 15 is made of a silicon oxide film having a low density (of about 1.2 to 1.3 $g/cm^3$), as compared to a silicon oxide film (density: about 2.3 $g/cm^3$) formed by a normal thermal CVD or plasma CVD process. The entire part of the second insulating film 12 located between the wiring grooves 14 serves as the reformed layer 15 in region A, whereas only part of the second insulating film 12 located between the wiring grooves 14 (i.e., in the vicinities of the wiring grooves 14) partially serves as the reformed layer 15 in region B.

Figure 1C:
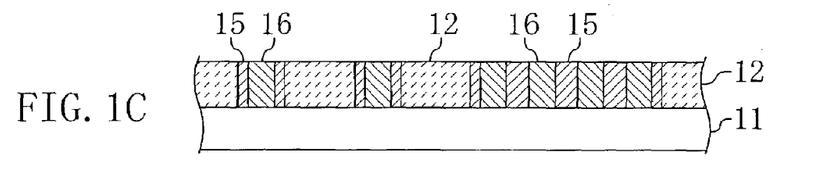

Subsequently, as shown in FIG. 1C, a conductive film 16 made of, for example, copper or an alloy of copper is deposited by, for example, an electroplating process over the second insulating film 12 provided with the reformed layer 15 such that the wiring grooves 14 are completely filled with the conductive film 16. Thereafter, a CMP process, for example, is performed to remove part of the conductive film 16 located outside the wiring grooves 14 as well as to completely expose the upper surface of the second insulating film 12. In this way, the surface of the wiring layer including the conductive film 16 buried in the wiring grooves 14 (hereinafter, referred to as wires 16) is planarized. At this time, the reformed layer 15 is formed in the vicinities of the wires 16 in the wiring layer.

Figure 1D:
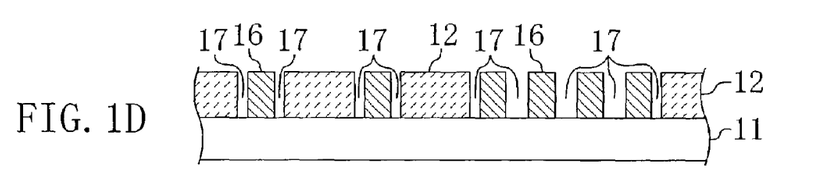

Then, as shown in FIG. 1D, a substrate in which the wires 16 have been formed is subjected to, for example, wet etching using a chemical solution containing hydrofluoric acid so that only the reformed layer 15 is selectively removed, thereby forming slits 17. As a result, in region A where the wires 16 are spaced at minimum intervals, only the slits 17 are present between the wires 16. On the other hand, in region B where the wires 16 are relatively widely spaced, there only exist, between every adjacent wires 16, the slits 17 located in the vicinities of the wires 16 and a part of the second insulating film 12 interposed between the slits 17.

As described in the process step shown in FIG. 1B, the reformed layer 15 is a low-density silicon oxide film. Accordingly, the reformed layer 15 is etched by hydrofluoric acid at a speed much higher than the second insulating film 12 as a carbon-containing silicon oxide film, the wires 16 (i.e., metal film 16), and the first insulating film 11 as a normal silicon oxide film. Therefore, in the process step shown in FIG. 1D, only the reformed layer 15 can be selectively removed. In addition, the insulating material constituting the second insulating film 12 is not limited to the carbon-containing silicon oxide film used in this embodiment so long as the material is changed by reforming with, for example, plasma to have the property of being easily removed by, for example, wet etching, as compared to other adjacent films (including non-reformed part of the second insulating film 12).

Figure 1E:
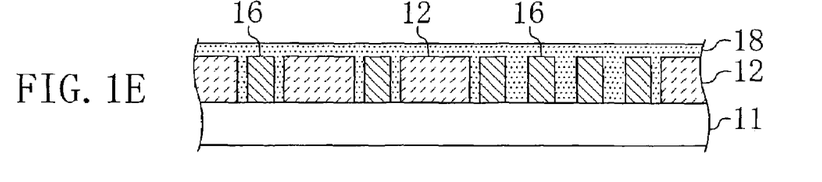

Then, as shown in FIG. 1E, a silicate glass film containing carbon, for example, is deposited over a substrate in which the wires 16 and the slits 17 have been formed, thereby filling the slits 17 completely. Subsequently, the carbon-containing silicate glass film is heated at about 400° C. to cause a cross-linking reaction therein, thereby forming a third insulating film (low-dielectric-constant film) 18 having a relative dielectric constant of about 2.0. The third insulating film 18 is adjacent to the second insulating film 12 having relatively high mechanical strength or the wires 16 (i.e., the metal film 16). Therefore, the third insulating film 18 itself does not need to have high mechanical strength.

Figure 1F:
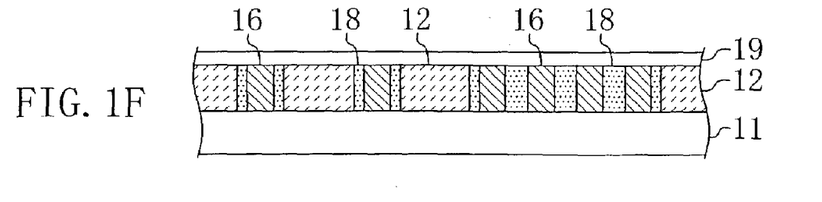

Next, as shown in FIG. 1F, a CMP process, for example, is performed to remove part of the third insulating film 18 located outside the slits 17 (i.e., part of the third insulating film 18 located above the upper surfaces of the wires 16 and the second insulating film 12) as well as to planarize the surface of the wiring layer including the wires 16. As a result, in region A, only the third insulating film 18 is present between the wires 16. On the other hand, in region B, there only exist, between every adjacent wires 16, parts of the third insulating film 18 in the vicinities of the wires 16 and a part of the second insulating film 12 interposed between the parts of the third insulating film 18.

Lastly, a fourth insulating film 19 of, for example, a silicon carbide film is deposited to a thickness of about 50 nm by, for example, a plasma CVD process over the entire surfaces of the second insulating film 12, wires 16, and third insulating film 18, thereby completing a wiring structure.

In this manner, in this embodiment, the third insulating film 18 with a small relative dielectric constant can be formed in respective parts of the wiring layer adjacent to the wires 16 without using a mask, thus fabricating a device having a small wire-to-wire capacitance and sufficient mechanical strength.

Hereinafter, formation of the reformed layer 15, which is a feature of this embodiment, will be described in detail.

In this embodiment, as described in the process step shown in FIG. 1B, the reformed layer 15 is formed by reforming the surface portion of the second insulating film 12, simultaneously with the removal of the resist 13 using oxygen plasma.

In this case, the thickness of the reformed layer 15 can be controlled using conditions for exposure to oxygen plasma and time for exposure to the oxygen plasma. Thus, in this embodiment, the thickness of the reformed layer 15 is controlled to be equal to or greater than about one-half of the minimum intervals between wires, for example. In this way, in region A where the wires 16 are spaced at minimum intervals, the entire part of the second insulating film 12 present between the wires 16 (more accurately, the wiring grooves 14) can be changed into the reformed layer 15 made of a silicon oxide film with low density. On the other hand, in region B where the wires 16 are relatively widely spaced, parts of the second insulating film 12 located at a distance equal to or smaller than a given distance from the wiring grooves 14 can be changed into the reformed layer 15 made of a silicon oxide film with low density.

Now, conditions for oxygen plasma for use in the formation of the reformed layer 15 are described.

Figure 2:
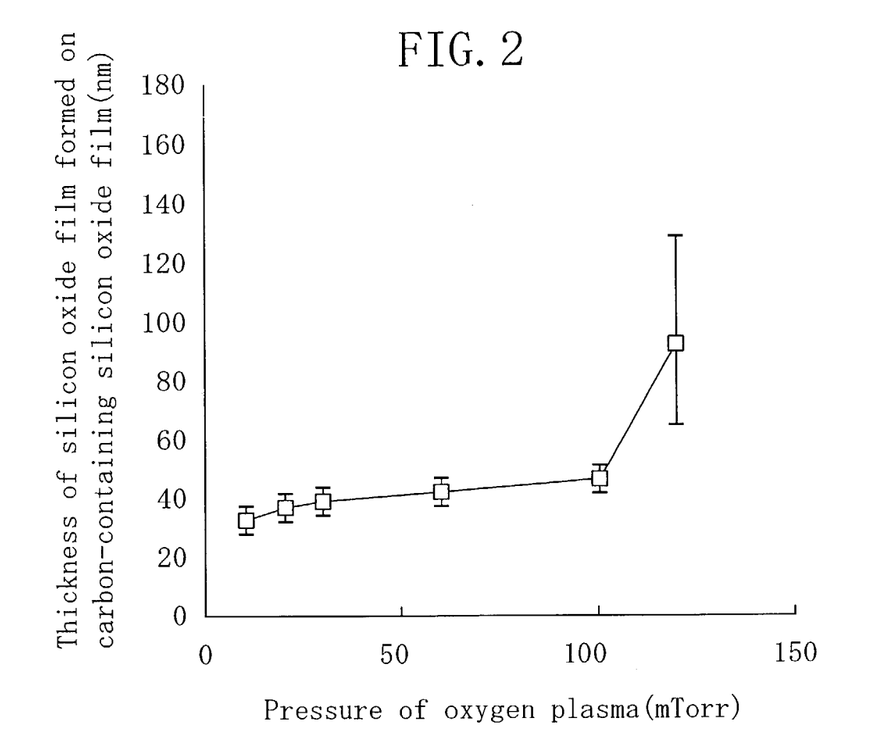
FIG. 2 is a graph showing a relationship between the pressure of oxygen plasma and the thickness of a silicon oxide film (a reformed layer) which is used in the method for fabricating an electric device of the first embodiment.

FIG. 2 shows a relationship between the pressure of oxygen plasma and the thickness of a silicon oxide film (i.e., a reformed layer) formed by reforming a carbon-containing silicon oxide film using the oxygen plasma, i.e., the dependence of the thickness of the silicon oxide film on the oxygen plasma pressure. In FIG. 2, the abscissa represents the pressure (unit: mTorr) of the oxygen plasma, and the ordinate represents the thickness (unit: nm) of the silicon oxide film formed by reforming.

As shown in FIG. 2, if the oxygen plasma pressure is 100 mTorr or less, the oxygen plasma pressure and the silicon oxide film thickness are directly proportional. Based on this relationship, the thickness of the silicon oxide film at a given oxygen plasma pressure can be predicted with relatively high accuracy. Accordingly, if the oxygen plasma pressure is set at an arbitrary pressure equal to or less than 100 mTorr, the thickness of the silicon oxide film (the reformed layer) can be controlled.

As described above, in this embodiment, the use of oxygen plasma allows a reformed layer 15 with a desired width to be formed in the surface portion of the second insulating film 12. In addition, the reformed layer 15 is easily removed by wet etching. Accordingly, such removal of the reformed layer 15 makes it possible to form the slits 17 without using a mask. Moreover, the width of the slits 17 depends on the width of the reformed layer 15 formed in the previous process step, whereas the width of the reformed layer 15 can be arbitrarily set by adjusting the plasma pressure. Accordingly, it is possible to form slits 17 with a desired width as well as slits 17 having a width smaller than the minimum width of a mask. The method for forming such slits 17 is more effective in a region where a very minute wiring pattern such as a pattern with a wiring width of 100 nm or less is provided.

In this embodiment, the third insulating film 18 with a very low dielectric constant is buried in the slits 17, so that the third insulating film 18 can be formed in the vicinities of the wires 16 (or in the entire wire-to-wire space in the case of closely-spaced wires 16). Accordingly, the effect of reducing the wire-to-wire capacitance is considerably high. On the other hand, in the region other than the vicinities of the wires 16 (i.e., a region which is part of the wire-to-wire space between widely-spaced wires 16 but is not the vicinity of the wires), the second insulating film 12 with a relative dielectric constant higher than that of the third insulating film (low-dielectric-constant film) 18, i.e., the second insulating film 12 with mechanical strength higher than that of the third insulating film 18, is formed. As a result, mechanical strength sufficient for the whole wiring layer (e.g., the strength with which the layer can sufficiently withstand a CNP process) is achieved.

Further, in this embodiment, after the wiring grooves 14 have been formed in the second insulating film 12, the reformed layer 15 is formed in parts of the second insulating film 12 located in the vicinities of the wiring grooves 14, and then the wires 16 are formed in the wiring grooves 14. Subsequently, the reformed layer 15 is selectively removed by etching, thereby forming the slits 17. Then, the third insulating film 18 as a low-dielectric-constant film is buried in the silts 17. As a result, the following advantages are obtained. That is to say, even in the case where a plurality of insulating films made of mutually different materials are used as inter-wiring insulating films in an identical wiring layer, no special masking process is needed. In addition, a pattern for wiring grooves is formed in the third insulating film 18, i.e., a low-dielectric-constant film, without using a mask, thus forming a minute wiring structure.

In this embodiment, a silicate glass film containing carbon is used as the third insulating film 18 serving as a low-dielectric-constant film. However, the material for the third insulating film 18 is not specifically limited so long as the material has a relative dielectric constant smaller than that of the second insulating film 12. Specifically, a carbon-containing silicon oxide film, a carbon-containing silicon nitride film, a carbon-doped oxide (CDO) film, an organic film, a hydrogen silsesquioxane (HSQ) film or a methyl silsesquioxane (MSQ) film, for example, may be used as the third insulating film 18.

Embodiment 2

Hereinafter, an electric device according to a second embodiment of the present invention will be described with reference to the drawings.

Figure 3:
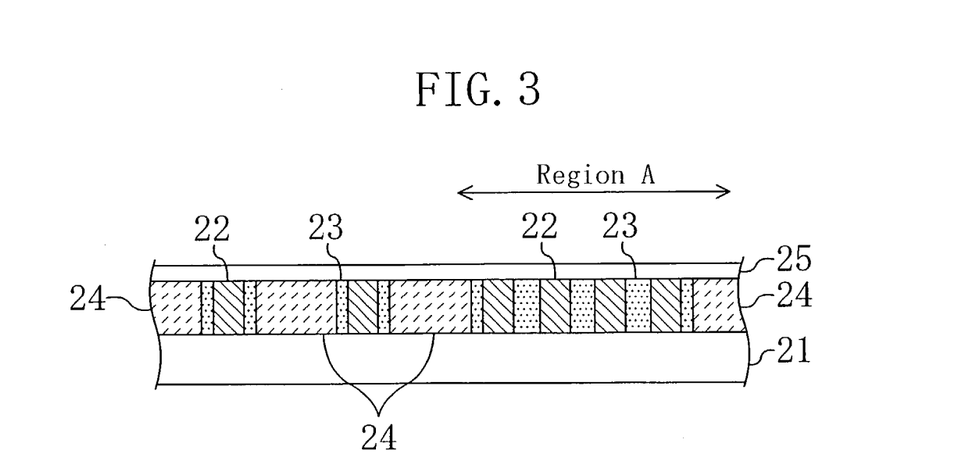
FIG. 3 is a cross-sectional view showing an electric device according to a second embodiment of the present invention.

FIG. 3 is a cross-sectional view showing the electric device (especially, a wiring structure) of the second embodiment.

As shown in FIG. 3, a wiring layer including wires 22 made of, for example, copper is formed on a first insulating film (e.g., a silicon oxide film) 21 formed on a silicon substrate (now shown). In the wiring layer, the wires 22 include: a plurality of wires which are relatively closely spaced (region A); and a plurality of wires which are relatively widely spaced (the region other than region A).

A low-dielectric-constant film (third insulating film) 23 having a width of about 50 nm and made of, for example, a carbon-containing silicon oxide film having a film hardness of 0.1 GPa and a relative dielectric constant of 2.0 is provided in the vicinities of the sides of the wires 22 in the wiring layer. In part of the wiring layer between the wires 22, a second insulating film 24 made of, for example, a carbon-containing silicon oxide film having a film hardness of 1.5 GPa and a relative dielectric constant of 3.0 is formed to be adjacent to the low-dielectric-constant film 23 provided in the vicinities of the wires 22. A fourth insulating film 25 of, for example, a silicon carbide film is formed on the wiring layer constituted by the wires 22, the second insulating film 24 and the low-dielectric-constant film 23.

It should be noted that in region A where the wires 22 are closely spaced (e.g., at intervals of 100 nm or less), only the low-dielectric-constant film 23 of a carbon-containing silicon oxide film having a relative dielectric constant of 2.0 is formed between wires 22.

As described above, in the wiring structure (wiring layer) of this embodiment, in a region where wires are closely spaced and thus the mechanical strength of the whole wiring structure is maintained by high mechanical strength of the wires, only the low-dielectric-constant film 23 is especially formed as an insulating film provided between the wires. On the other hand, in a region where wires are relatively widely spaced and thus the mechanical strength of the whole wiring structure is not maintained by the mechanical strength of the wires, the low-dielectric-constant film 23 is especially used only in the vicinities of the wires 22, and the second insulating film 24 with mechanical strength higher than that of the low-dielectric-constant film 23 is used as an insulating film provided in wire-to-wire spaces other than the vicinities of the wires 22.

Now, three advantages obtained in the wiring structure of this embodiment are described.

Firstly, a first advantage obtained in the wiring structure of this embodiment is reduction in wire-to-wire capacitance.

Specifically, as shown in FIG. 3, in a region (region A) where wiring intervals are small, i.e., the wires 22 are densely arranged, the low-dielectric-constant film 23 is used in the entire space between the wires 22. In a region where wiring intervals are relatively large, i.e., the wires 22 are sparsely arranged, at least an insulating film located in the vicinities of the wires 22 is the low-dielectric-constant film 23, as in region A. That is to say, in the wiring structure of this embodiment, the low-dielectric-constant film 23 is provided on both sides of all the wires 22, irrespective of wiring intervals, thus reducing the wire-to-wire capacitance.

Figure 4:
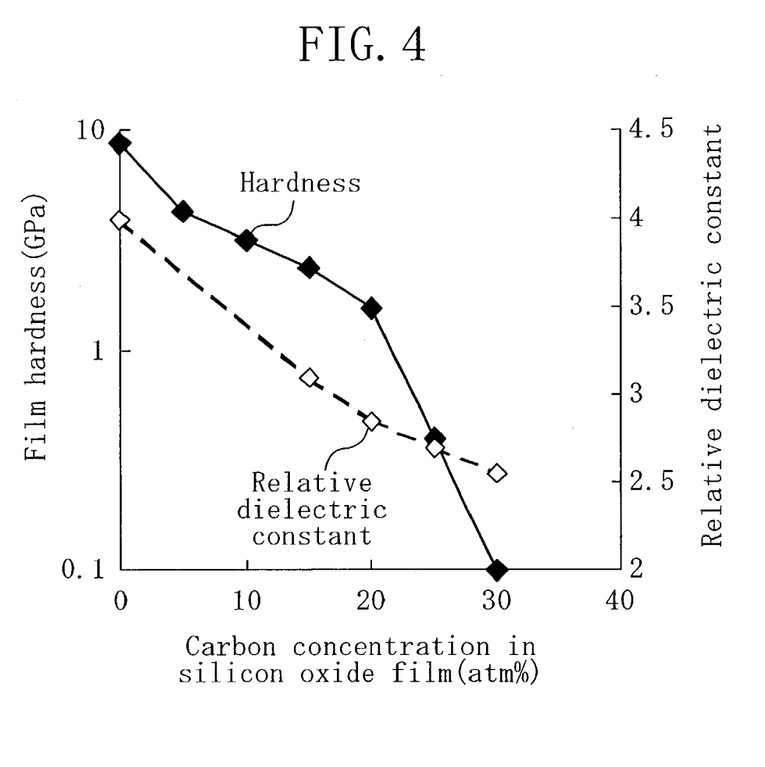
FIG. 4 is a graph showing a relationship between the carbon concentration in a silicon oxide film and the relative dielectric constant of the silicon oxide film, and a relationship between the carbon concentration in the silicon oxide film and the hardness of the silicon oxide film.

Now, a relationship between the carbon concentration in a silicon oxide film and the relative dielectric constant of the silicon oxide film, and a relationship between the carbon concentration in the silicon oxide film and the hardness of the silicon oxide film, are described with reference to FIG. 4. In FIG. 4, the abscissa represents the carbon concentration (unit: atm %) in the silicon oxide film, the left-side ordinate represents the film hardness (unit: GPa), and the right-side ordinate represents the relative dielectric constant. As shown in FIG. 4, it was found that with respect to a most general carbon-containing silicon oxide film in which terminal groups of silicon are methyl groups, for example, as the carbon concentration in the film increases, the film hardness decreases and the relative dielectric constant decreases. That is to say, an insulating film having a high carbon concentration exhibits a low dielectric constant and low mechanical strength.

Next, a second advantage in the wiring structure of this embodiment is the capability of maintaining the strength of the wiring structure.

Specifically, as shown in FIG. 3, in a region where the wires 22 are closely spaced, i.e., in region A where the wires 22 are densely arranged, the entire part of the insulating film between the wires 22 is made of a carbon-containing silicon oxide film (low-dielectric-constant film 23) having a film hardness of 0.1 GPa and a relative dielectric constant of 2.0. However, since the wires 22 having relatively high mechanical strength are densely arranged in region A, mechanical strength sufficient for the wiring structure (e.g., the strength with which the wiring structure is not deformed by, for example, external physical factors during a CMP process for forming wiring or after the formation of the wiring) can be maintained.

On the other hand, in a region where the wires 22 are relatively widely spaced, i.e., a region where the wires 22 are sparsely arranged (the region other than region A), wiring intervals are large. Accordingly, if the low-dielectric-constant film 23 were used in the entire wire-to-wire space, the mechanical strength of the wiring structure in this region could not be sufficiently maintained only by the mechanical strength of the wires 22. To prevent this, in this embodiment, the low-dielectric-constant film 23 is used as the inter-wiring insulating film located in the vicinities of the sides of the wires 22 to reduce the wire-to-wire capacitance in the region where the wires 22 are sparsely arranged. As the other inter-wiring insulating film, i.e., an inter-wiring insulating film provided in the region other than the vicinities of the wires, the second insulating film 24 having relatively high mechanical strength (more specifically, a carbon-containing silicon oxide film having a film hardness of 1.5 GPa and a relative dielectric constant of 3.0) is used. In this manner, the mechanical strength of the whole wiring structure can be maintained.

Lastly, a third advantage in the wiring structure of this embodiment is enhancement of the reliability of the wiring structure by utilizing properties of an inter-wiring insulating film itself.

Specifically, as shown in FIG. 3, the low-dielectric-constant film 23 having a low dielectric constant and low mechanical strength is present in the vicinities of the sides of the wires 22. Since the low-dielectric-constant film 23 is a soft film as compared to the wires 22, the low-dielectric-constant film 23 can cushion the tensile stress of the wires 22 or the compressive stress of the second insulating film 24, for example, to some extent. In lo other words, the low-dielectric-film 23 functions as a buffer in the wiring layer. Accordingly, the stress to the wires 22 is reduced, so that it is possible to prevent the wires 22 from causing plastic deformation with time, thus enhancing the reliability of the wires 22.

In this embodiment, a carbon-containing silicon oxide film is used as the low-dielectric-constant film 23. However, the material for the low-dielectric-constant film 23 is not specifically limited so long as the material has a relative dielectric constant smaller than that of the second insulating film 24. Specifically, as the low-dielectric-constant film 23, a carbon-containing silicon oxide film, a carbon-containing silicon nitride film, a CDO film, an organic film, an HSQ film or an MSQ film, for example, may be used.

What is claimed is:

1. An electric device comprising:
   a layer having a plurality of first wirings and a plurality of second wirings;
   a first low-dielectric-constant film formed in a space between at least one adjacent pair of the first wirings; and
   a second low-dielectric-constant film formed in a space between at least one adjacent pair of the second wirings,
   wherein the top surface of the second low-dielectric-constant film is substantially at the same level as the top surface of the second wirings,
   the space between the adjacent pair of the first wirings is narrower than the space between the adjacent pair of the second wirings,
   the second low-dielectric-constant film has a mechanical strength higher than that of the first low-dielectric-constant film, and
   the first low-dielectric-constant film is formed in the space between the adjacent pair of the second wirings.

2. An electric device comprising:
   a layer having a plurality of first wirings and a plurality of second wirings;
   a first low-dielectric-constant film including a carbon formed in a space between at least one adjacent pair of the first wirings; and
   a second low-dielectric-constant film including a carbon formed in a space between at least one adjacent pair of the second wirings,
   wherein the space between the adjacent pair of the first wirings is narrower than the space between the adjacent pair of the second wirings, and
   a carbon concentration of the first low-dielectric-constant film is higher than that of the second low-dielectric-constant film.

3. An electric device comprising:
   a layer having a plurality of first wirings and a plurality of second wirings;
   a first low-dielectric-constant film having a hardness of 0.1 GPa formed in a space between at least one adjacent pair of the first wirings; and
   a second low-dielectric-constant film having a hardness of 1.5 GPa formed in a space between at least one adjacent pair of the second wirings,
   wherein the space between the adjacent pair of the first wirings is narrower than the space between the adjacent pair of the second wirings.

4. The electric device of claim 2, wherein the first low-dielectric-constant film is formed in the space between the adjacent pair of the second wirings.

5. The electric device of claim 3, wherein the first low-dielectric-constant film is formed in the space between the adjacent pair of the second wirings.

6. The electric device of claim 1, wherein the first low-dielectric-constant film is in contact with each side of the plurality of first wirings and the plurality of second wirings.

7. The electric device of claim 4, wherein the first low-dielectric-constant film is in contact with each side of the plurality of first wirings and the plurality of second wirings.

8. The electric device of claim 1, wherein a silicon carbide layer is formed on said layer.

9. The electric device of claim 2, wherein a silicon carbide layer is formed on said layer.

10. The electric device of claim 1, wherein a distance between at least one adjacent pair of the first wirings is 100 nm or less.

11. The electric device of claim 2, wherein a distance between at least one adjacent pair of the first wirings is 100 nm or less.

12. The electric device of claim 1, wherein the first low-dielectric-constant film and the second low-dielectric-constant film are carbon-containing silicon oxide films, and
    a carbon concentration of the first low-dielectric-constant film is higher than that of the second low-dielectric-constant film.

13. The electric device of claim 2, wherein the first low-dielectric-constant film and the second low-dielectric-constant film are carbon-containing silicon oxide films.

14. The electric device of claim 3, wherein the first low-dielectric-constant film and the second low-dielectric-constant film are carbon-containing silicon oxide films, and
    a carbon concentration of the first low-dielectric-constant film is higher than that of the second low-dielectric-constant film.

15. The electric device of claim 1, wherein the first low-dielectric-constant film has a relative dielectric constant of substantially 2.0 or less, and
    the second low-dielectric-constant film has a relative dielectric constant of substantially 3.0 or more.

16. The electric device of claim 2, wherein the first low-dielectric-constant film has a relative dielectric constant of substantially 2.0 or less, and
    the second low-dielectric-constant film has a relative dielectric constant of substantially 3.0 or more.

17. The electric device of claim 1, wherein the first low-dielectric-constant film has a hardness of substantially 0.1 GPa, and
the second low-dielectric-constant film has a hardness of substantially 1.5 GPa.

18. The electric device of claim 1, wherein the first low-dielectric-constant film is a carbon-containing silicon oxide film, a carbon-containing silicon nitride film, a CDO film, an organic film, an HSQ film or an MSQ film.

19. The electric device of claim 2, wherein the first low-dielectric-constant film is a carbon-containing silicon oxide film, a carbon-containing silicon nitride film, a CDO film, an organic film, an HSQ film or an MSQ film.

20. The electric device of claim 1, wherein the space between at least one adjacent pair of the first wirings is completely filled with the first low-dielectric-constant film.

21. The electric device of claim 2, wherein the space between at least one adjacent pair of the first wirings is completely filled with the first low-dielectric-constant film.

22. An electric device comprising:
a layer having a plurality of first wirings and a plurality of second wirings;
a first low-dielectric-constant film formed in a space between at least one adjacent pair of the first wirings; and
a second low-dielectric-constant film formed in a space between at least one adjacent pair of the second wirings,
wherein the top surface of the second low-dielectric-constant film is substantially at the same level as the top surface of the second wirings,
the space between the adjacent pair of the first wirings is narrower than the space between the adjacent pair of the second wirings,
the second low-dielectric-constant film has a mechanical strength higher than that of the first low-dielectric-constant film,
the first low-dielectric-constant film and the second low-dielectric-constant film are carbon-containing silicon oxide films, and
a carbon concentration of the first low-dielectric-constant film is higher than that of the second low-dielectric-constant film.

23. An electric device comprising:
a layer having a plurality of first wirings and a plurality of second wirings;
a first low-dielectric-constant film formed in a space between at least one adjacent pair of the first wirings; and
a second low-dielectric-constant film formed in a space between at least one adjacent pair of the second wirings,
wherein the top surface of the second low-dielectric-constant film is substantially at the same level as the top surface of the second wirings,
the space between the adjacent pair of the first wirings is narrower than the space between the adjacent pair of the second wirings,
the second low-dielectric-constant film has a mechanical strength higher than that of the first low-dielectric-constant film,
the first low-dielectric-constant film has a hardness of substantially 0.1 GPa, and
the second low-dielectric-constant film has a hardness of substantially 1.5 GPa.

* * * * *